United States Patent
Quiquempoix (10) Patent No.: US 8,970,415 B2
(45) Date of Patent: Mar. 3, 2015

(54) MULTI-LEVEL CAPACITIVE DAC

(71) Applicant: Microchip Technology Incorporated, Chandler, AZ (US)

(72) Inventor: Vincent Quiquempoix, Divonne les bains (FR)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 14/197,401

(22) Filed: Mar. 5, 2014

(65) Prior Publication Data

US 2014/0253354 A1    Sep. 11, 2014

Related U.S. Application Data

(60) Provisional application No. 61/776,620, filed on Mar. 11, 2013.

(51) Int. Cl.
*H03M 3/00*    (2006.01)
*H03M 1/06*    (2006.01)

(52) U.S. Cl.
CPC ............ *H03M 1/0665* (2013.01); *H03M 3/464* (2013.01); *H03M 3/424* (2013.01)
USPC .......................................... 341/143; 341/155

(58) Field of Classification Search
CPC ..... H03M 3/50; H03M 1/0665; H03M 3/424; H03M 3/464
USPC .......................... 341/155, 143, 144, 163, 172
See application file for complete search history.

(56) References Cited

U.S. PATENT DOCUMENTS

| | | | |
|---|---|---|---|
| 5,818,377 A | 10/1998 | Wieser | 341/144 |
| 6,873,276 B2 * | 3/2005 | Yang et al. | 341/143 |
| 7,102,558 B2 | 9/2006 | Deval | 341/150 |
| 7,812,753 B1 * | 10/2010 | Myles et al. | 341/144 |
| 7,961,126 B2 | 6/2011 | Deval et al. | 341/131 |
| 7,994,958 B2 | 8/2011 | Quiquempoix et al. | 341/150 |
| 8,009,077 B1 | 8/2011 | Melanson | 341/155 |
| 2014/0167995 A1 * | 6/2014 | Tiew et al. | 341/143 |

FOREIGN PATENT DOCUMENTS

EP    2237424 A1    10/2010    ............. H03M 1/06

OTHER PUBLICATIONS

Adams, R.W. et al., "Theory and Practical Implementation of a Fifth-Order Sigma-Delta A/D Converter," AES Journal of Audio Engineering Society, vol. 39, No. 7/8, 14 pages, Jul. 1991.
Alexander, Mark A. et al., "A 192ks/s Sigma-Delta ADC with Integrated Decimation Filters Providing -97.4dB THD," IEEE International Solid-State Circuit Conference, 2 pages, Feb. 17, 1994.
International Search Report and Written Opinion, Application No. PCT/US2014/021260, 11 pages, Jul. 7, 2014.

* cited by examiner

*Primary Examiner* — Peguy Jean Pierre
(74) *Attorney, Agent, or Firm* — King & Spalding L.L.P.

(57) ABSTRACT

A digital-to analog converter (DAC) of the charge transfer type can be used in a sigma delta modulator for generating N output levels, wherein an output level is defined by a respective amount of charge transferred by the DAC. The DAC has a first capacitor switch unit receiving a reference voltage and a first digital input value to transfer first output charges, at least one second capacitor switch unit receiving the reference voltage and a second digital input value, wherein an output of the second capacitor switch unit is coupled in parallel with an output of the first capacitor switch unit to generate a sum of first and second transferred output charges; and a sequencer controlling switches of the first and second capacitor switch units wherein switching sequences according to individual first and second digital input values are provided for every DAC input value to generate the N output levels.

29 Claims, 7 Drawing Sheets

| DAC input | P1 transfer on C1 | P2 transfer on C1 | P1 transfer on C2 | P1 transfer on C2 | Sum of all transfers | Average of lines with same DAC input normalized to $3/(2*(Cref1+Cref2)*Vref)$ |
|---|---|---|---|---|---|---|
| 3 | Cref1*Vref | Cref1*Vref | Cref2*Vref | Cref2*Vref | 2*Cref1+2*Cref2)*Vref | 3 |
| 2 | 0 | 0 | Cref2*Vref | Cref2*Vref | 2*Cref2*Vref | |
| 2 | Cref1*Vref | Cref1*Vref | Cref2*Vref | 0 | (2*Cref1+Cref2)*Vref | 2 |
| 2 | Cref1*Vref | Cref1*Vref | 0 | Cref2*Vref | (Cref1+2*Cref2)*Vref | |
| 1 | Cref1*Vref | Cref1*Vref | 0 | 0 | 2*Cref1*Vref | |
| 1 | Cref1*Vref | -Cref1*Vref | Cref2*Vref | Cref2*Vref | (2*Cref2-2*Cref1)*Vref | 1 |
| 0 | 0 | 0 | 0 | 0 | 0 | 0 |
| -1 | -Cref1*Vref | -Cref1*Vref | 0 | 0 | -2*Cref1*Vref | |
| -1 | Cref1*Vref | Cref1*Vref | -Cref2*Vref | -Cref2*Vref | -(2*Cref2-2*Cref1)*Vref | -1 |
| -2 | Cref1*Vref | Cref1*Vref | -Cref2*Vref | 0 | -Cref2*Vref | |
| -2 | 0 | 0 | -Cref2*Vref | -Cref2*Vref | -2*Cref2*Vref | |
| -2 | -Cref1*Vref | -Cref1*Vref | -Cref2*Vref | 0 | -(2*Cref1+Cref2)*Vref | -2 |
| -2 | -Cref1*Vref | -Cref1*Vref | 0 | -Cref2*Vref | -(Cref1+2*Cref2)*Vref | |
| -3 | -Cref1*Vref | -Cref1*Vref | -Cref2*Vref | -Cref2*Vref | -2(Cref1+Cref2)*Vref | -3 |

MULTI-LEVEL CAPACITIVE DAC

CROSS-REFERENCE TO RELATED APPLICATIONS

This application claims the benefit of U.S. Provisional Application No. 61/776,620 filed on Mar. 11, 2013, which is incorporated herein in its entirety.

TECHNICAL FIELD

The present disclosure relates to a charge transfer digital to analog converters (DAC), in particular use of such DAC in a sigma delta modulators. The present disclosure also relates to a multi-level capacitive DAC using minimal number of capacitors and minimal dynamic element matching sequences.

TECHNICAL FIELD

Analog-to-digital converters are in widespread use today in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor sigma-delta converter.

Figure 1:
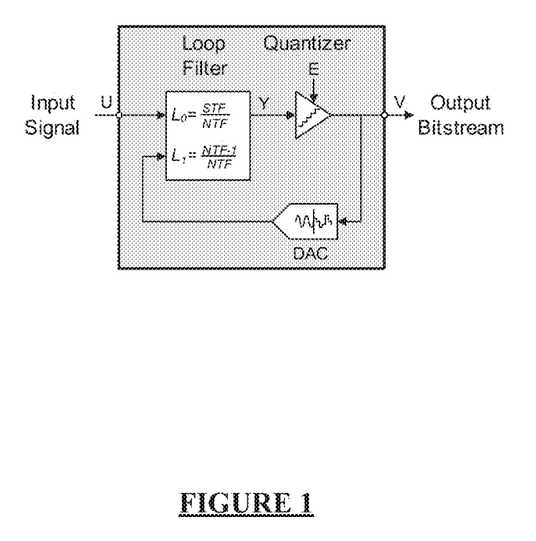
FIG. 1 shows a block diagram of sigma delta modulator.

As many analog-to-digital converters, the switched capacitor sigma-delta converter uses a digital-to-analog converter DAC in a feedback loop as shown in FIG. 1 and cannot be more linear than the digital-to-analog converter. An input signal U is fed to a Loop Filter. The output signal Y of the Loop Filter is forwarded to a Quantizer which provides the output bitstream V. This bitstream V is fed back to the DAC whose output is fed back to the Loop Filter. Therefore a very linear digital-to-analog converter is required in order to achieve a perfectly linear analog-to-digital conversion. However a high resolution is not required for the digital-to-analog converter used in the feedback loop of a sigma-delta converter: The digital-to-analog resolution can be exchanged with the over-sampling ratio at the cost of a longer conversion time.

A two-level digital-to-analog converter is inherently linear and thus is not the limiting factor for the accuracy of a sigma-delta converter. Therefore it is the standard approach in a sigma-delta analog-to-digital converter. Such A/D converters are for example disclosed in the article "A 192 ks/s Sigma-Delta ADC with integrated DecimationFilters Providing −97.4 dB THD" by Mark A. Alexander, Hessam Mohajeri, and Justin O. Prayogo in IEEE International Solid State Circuit Conference 37 (1994) February, New York, US, and "Theory and Practical Implementation of a fifth-Order Sigma-Delta A/D Converter" by R. W. Adams, P. F. Ferguson, A. Ganesan, S. Vincelette, A. Volpe, and R. Libert in AES Journal of the Audio Engineering Society 39 (1991) July/August, No. 7/8., New York, US. A five level feedback digital-to-analog converter is also known from U.S. Pat. No. 7,102,558 assigned to Applicant which is hereby incorporated by reference.

In sigma delta converters, capacitive charge transfer DACs are often used to realize the feedback of the modulator if the modulator is made of switched capacitors. Multi-bit architectures have nice advantages including less quantization noise, more stability, less sensitivity to idle tones as well as better distortion behavior. Since the DAC output resides at the input of the modulator, the inaccuracies of the DAC are directly transmitted to the signal and are difficult to compensate for. Therefore, it is critical to be able to realize linear DACs with as many levels as possible (making a multi level flash ADC is easier since in a sigma delta modulator, it does not require as much accuracy as the DAC as it stands at the end of the signal chain). Multi-level DAC with more than 5 levels require multiple capacitors and dynamic element matching to be able to transfer the signals in two phases (most of the sigma delta modulators based on switched capacitors have two phases one for sampling signals one for transferring signals to the next stage). These multi-level DACs are typically realized as charge transfer DAC. In these type of DACs, each output level is defined by a different amount of electrical charge transferred to the output of the DAC. Thus, a charge transfer DAC is transferring charges and therefore operates differently than a voltage or current DAC.

SUMMARY

According to various embodiments, a sigma delta analog to digital converter can be provided with a multi-level DAC of the charge transfer type that has more levels than conventional charge transfer DACs used in such converters with a minimal amount of matched and unmatched capacitors wherein a relatively simple dynamic matching technique is used.

According to an embodiment, a digital-to analog converter (DAC) of the charge transfer type for use in a sigma delta modulator for generating N output levels, wherein an output level is defined by a respective amount of charge transferred by the DAC, may comprise: a first capacitor switch unit receiving a reference voltage and a first digital input value and being operable to transfer a first plurality of output charges, at least one second capacitor switch unit receiving the reference voltage and a second digital input value, wherein an output of the second capacitor switch unit is coupled in parallel with an output of the first capacitor switch unit to generate a sum of the first plurality of transferred output charges and a second plurality of transferred output charges from the second capacitor switch unit; and a sequencer operable to control switches of the first and second capacitor switch units wherein switching sequences according to individual first and second digital input values are provided for every DAC input value to generate the N output levels.

According to a further embodiment, the switching sequences can be chosen such that at least one of the N output levels generated by respective first and second plurality of transferred output charges is proportional to a sum of the capacitors of the first and second capacitor switch unit. According to a further embodiment, for each of the N output levels which is not proportional to a sum of the capacitors of the first and second capacitor switch unit, at least one alternative switching sequence can be provided to transfer a respective charge, wherein an average DAC output charge of sequential DAC input values having the same value is proportional to a sum of the capacitors of the first and second capacitor switch unit by changing associated switching sequences for the first and/or second capacitor switch unit. According to a further embodiment, a switching sequence may comprise a sampling phase followed by a transfer phase. According to a further embodiment, a plurality of switching sequences can be available to generate transferred output charges associated with one DAC input value for the first and/or second capacitor switch units and the sequencer is configured to shuffle an order of the plurality of switching sequences with a pseudo random algorithm. According to a further embodiment, a switching sequence may comprise a sampling phase followed by a transfer phase and wherein the voltage reference is generated by a chopper voltage reference toggling between the sampling and transfer phases. According to a further embodiment, the DAC can be configured to generate 7 output levels.

According to another embodiment, a sigma delta modulator may comprise such a DAC, and further comprise a capacitive input switch unit receiving an input signal and having an output coupled in parallel with the outputs of the parallel coupled capacitive switch units.

According to a further embodiment of the sigma delta modulator, the capacitive input switch unit transfers an output charge having a gain A. According to a further embodiment of the sigma delta modulator, the sigma delta modulator may further comprise a plurality of second capacitor switch units coupled in parallel with the first capacitor switch unit. According to a further embodiment of the sigma delta modulator, the sigma delta modulator may further comprise a switching network coupling the parallel coupled outputs of the capacitive switch units and the capacitive input switch unit with a differential amplifier.

According to yet another embodiment, a method for generating N output levels by means of a digital-to analog converter (DAC) of the charge transfer type, may comprise: generating a first one of a plurality of output charges defined by a first digital input value by a first capacitor switch unit receiving a reference voltage by controlling a first switching sequence according to at least one predefined switching sequence defined by the first digital input value to transfer the first one of a plurality of output charges, generating a second one of a plurality of output charges defined by a second digital input value by a second capacitor switch unit receiving the reference voltage by controlling a second switching sequence according to at least one predefined switching sequence defined by the second digital input value to transfer the second one of a plurality of output charges, wherein the first and second digital input value depend on a selected digital input value for the DAC; and adding the first and second one of a plurality of output charges to generate an output level of the DAC.

According to a further embodiment of the method, the first and second switching sequences may be chosen such that at least one of the N output levels generated by respective first and second plurality of transferred output charges is proportional to a sum of capacitance values of the first and second capacitor switch unit. According to a further embodiment of the method, for each of the N output levels which is not proportional to a sum of capacitance values of the first and second capacitor switch unit, at least one alternative switching sequence can be provided to transfer a respective charge, wherein an average DAC transferred charge output charge of sequential DAC input values having the same value is proportional to a sum of the capacitance values of the first and second capacitor switch unit by changing associated switching sequences for the first and/or second capacitor switch unit. According to a further embodiment of the method, a switching sequence may comprise a sampling phase followed by a transfer phase. According to a further embodiment of the method, a plurality of switching sequences may be available to generate transferred output charges associated with one DAC input value for the first and/or second capacitor switch units and the sequencer shuffles an order of the plurality of switching sequences with a pseudo random algorithm. According to a further embodiment of the method, a switching sequence may comprise a sampling phase followed by a transfer phase and further comprising generating the voltage reference by a chopper voltage reference toggling between the sampling and transfer phases. According to a further embodiment of the method, the DAC may generate 7 output levels. According to a further embodiment of the method, the method may comprise transferring a plurality of second output charges which are added to the first one of a plurality of transferred output charges.

According to yet another embodiment, a method of operating a sigma delta modulator using a digital-to analog converter (DAC) of the charge transfer type, may comprise generating a first one of a plurality of output charges defined by a first digital input value by a first capacitor switch unit of the DAC receiving a reference voltage by controlling a first switching sequence according to at least one predefined switching sequence defined by the first digital input value to transfer the first one of a plurality of output charges, generating a second one of a plurality of output charges defined by a second digital input value by a second capacitor switch unit of the DAC receiving the reference voltage by controlling a second switching sequence according to at least one predefined switching sequence defined by the second digital input value to transfer the second one of a plurality of output charges, wherein the first and second digital input value depend on a selected digital input value for the analog-to-digital converter of the sigma-delta modulator; adding the first, and second output charges of the DAC to generate an output charge of the DAC corresponding to a digital input value of the DAC; receiving an input voltage at a capacitive input unit generating a third output charge; and adding the third output charge to the first and second output charge of the DAC to generate an output voltage of an input stage of the sigma delta modulator.

According to a further embodiment of the above method, the method may further comprise integrating the output voltage of the input stage. According to a further embodiment of the above method, the method may further comprise quantizing the integrated output signal. According to a further embodiment of the above method, the first and second switching sequences can be chosen such that at least one of the output charges of the DAC is proportional to a sum of capacitance values of the first and second capacitor switch unit. According to a further embodiment of the above method, for each transferred output charge of the DAC corresponding to a digital input of the DAC which is not proportional to a sum of capacitance values of the first and second capacitor switch unit, at least one alternative switching sequence may be provided for the first and/or second capacitive switch units of the DAC to generate an average DAC output charge that is proportional to a sum of the capacitance values of the first and second capacitor switch unit by changing associated switching sequences the first and/or second capacitor switch unit for consecutive DAC input values having the same value. According to a further embodiment of the above method, a switching sequence may comprise a sampling phase followed by a transfer phase. According to a further embodiment of the above method, a plurality of switching sequences can be available to generate transferred output charges associated with one DAC input value for the first and/or second capacitor switch units and the sequencer shuffles an order of the plurality of switching sequences with a pseudo random algorithm. According to a further embodiment of the above method, a switching sequence may comprise a sampling phase followed by a transfer phase and further comprising generating the voltage reference by a chopper voltage reference toggling between the sampling and transfer phases. According to a further embodiment of the above method, the DAC may generates 7 output voltages. According to a further embodiment of the above method, the method may further comprise transferring a plurality of second output charges which are added to the first one of a plurality of output charges.

DETAILED DESCRIPTION

According to various embodiments, a multi-bit switched capacitive DAC of the charge transfer type can be provided with more levels than conventional charge transfer DACs used in sigma delta converters, for example, 4n+1 levels, using only a minimum amount of capacitors and minimal dynamic element matching and a reduced number of switches whereas conventional DAC's use n capacitance elements which otherwise may only lead to n+1 levels using the standard configuration. The proposed improvement leads to more accurate sigma delta devices using approximately same size and same power than existing devices.

Figure 2:
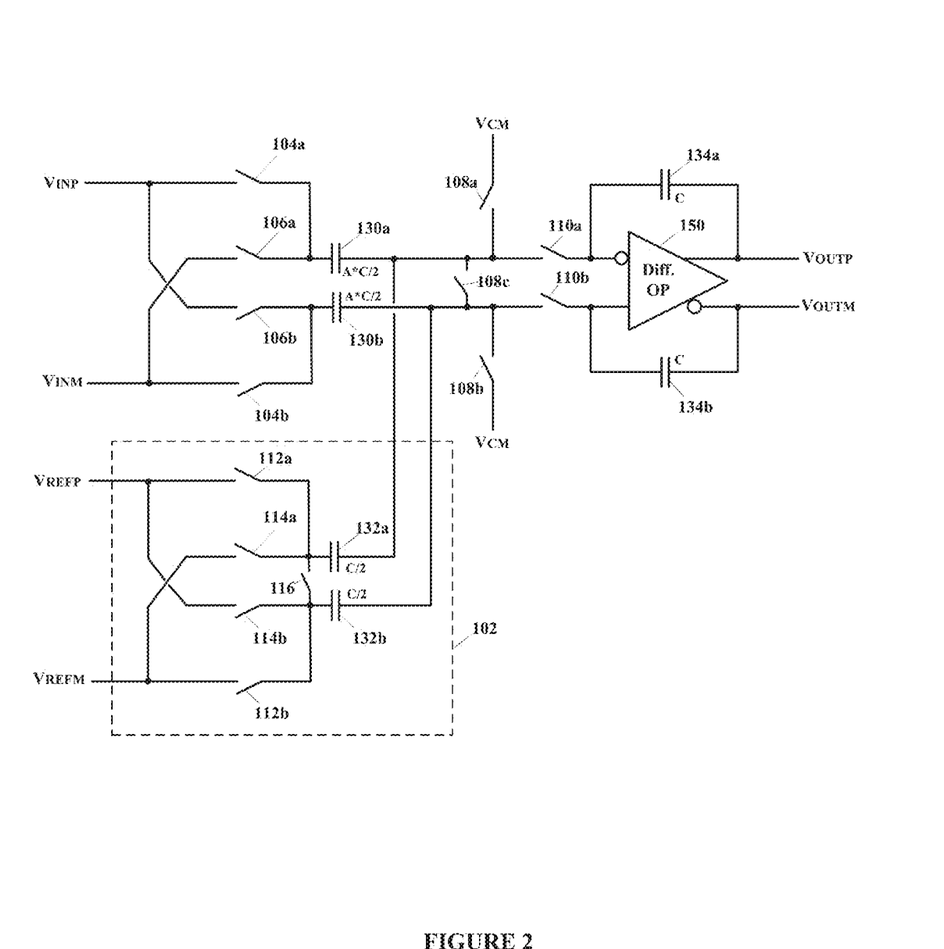
FIG. 2 shows a circuit diagram of a conventional input stage with a DAC of the transfer charge type.

U.S. Pat. No. 7,102,558, assigned to Applicant, which is hereby incorporated by reference, describes a 5-level DAC using one pair of capacitors in the switch stage coupled with the reference voltage that is inherently linear and designed with just 5 switches and some logic gates. According to various embodiments, such a DAC can be enhanced to have multiple of the switching units in parallel in order to go beyond a 5 level resolution. FIG. 2 shows an exemplary circuit diagram realizing the input stage of a conventional sigma-delta ADC according to an embodiment disclosed in U.S. Pat. No. 7,102,558.

In FIG. 2, an input stage of a sigma delta modulator formed by capacitor switching arrays and a differential amplifier for a five level feed-back digital-to-analog converter (DAC) of the charge transfer type are shown. With respect to the reference voltage, the circuit 100 uses a switching sequence that generates five equally spaced charge quantities during two phases (precharge+transfer) of a differential charge transfer. Thus, the five equally distributed charge levels may be C*Vref, C*Vref/2, 0, −C*Vref/2 and −C*Vref. The reference voltage (Vref=Vrefp−Vrefm) charging circuit is generally represented by the numeral 102 and comprises transfer reference capacitors 132a and 132b, and switches 112, 114 and 116. The remainder of the specific exemplary embodiment comprises voltage input capacitors 130a and 130b, switches 104, 106, 108 and 110, and differential operational amplifier 150 having feed-back sampling capacitors 134a and 134b. Switches 108a and 108b may relate to common mode operation, and switch 108c may relate to differential signal operation.

Vrefp and Vrefm represent voltages at the differential reference input terminals. The reference voltage Vref=Vrefp−Vrefm. Vinp and Vinm represent voltages at the differential input signal terminals. The input signal voltage Vin=Vinp−Vinm. The transfer reference capacitors 132a and 132b may be equal to C/2. The input sampling capacitors 130a and 130b may be equal to A*C/2. The feed-back capacitors 134a and 134b may be equal to $C_{FB}$. The input voltage is: Vin=Vinp−Vinm, and the output voltage is: Vout=Voutp−Voutm. The gain of the circuit shown is A. According to U.S. Pat. No. 7,102,558 specific switching sequences are applied to the various switches to provide for a five level DAC.

Figure 5A:
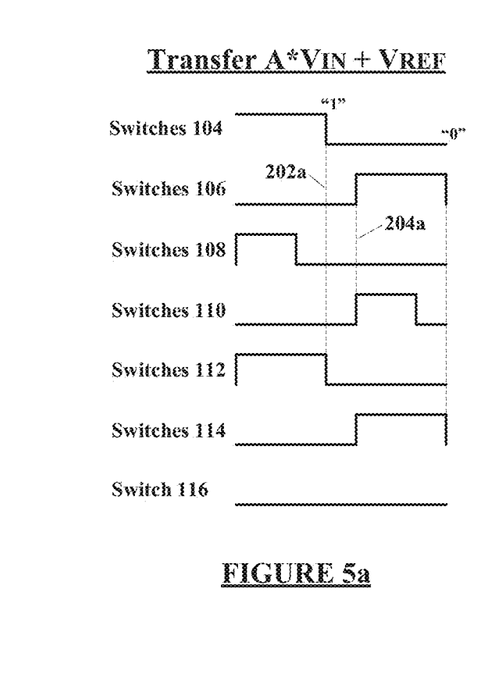
FIG. 5a-5e shows exemplary switching sequences to achieve five different transfer charges.

FIGS. 5a-e shows exemplary two-phase sequences for generating 5 different values with a single stage. For transferring a positive charge C*VREF, as shown in FIG. 5a, the capacitors 132a and 132b are connected to VREFP and VREFM, respectively, during the precharge phase 202a and switched to VREFM and VREFP, respectively, during the transfer phase 204a. The charge transferred is equal to C/2*(VREFP−VREFM)−C/2*(VREFM−VREFP)=C*VREF.

Figure 5B:
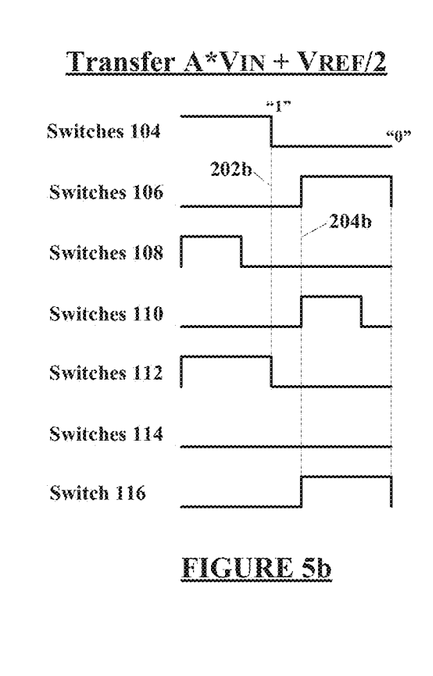
Figure 5C:
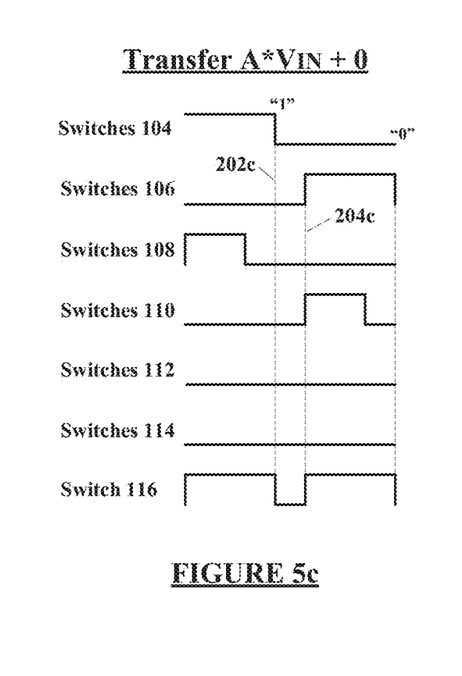
Figure 5D:
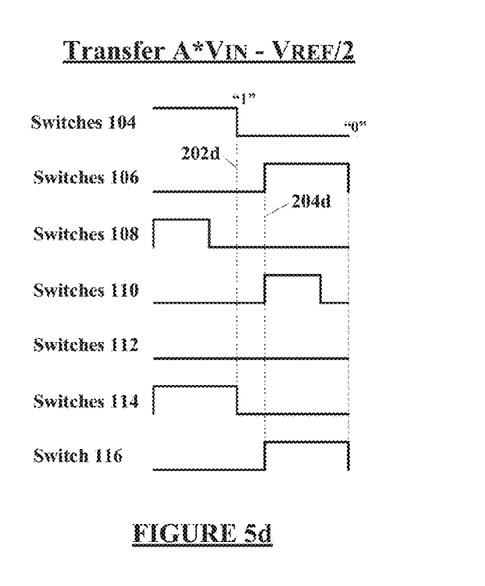
Figure 5E:
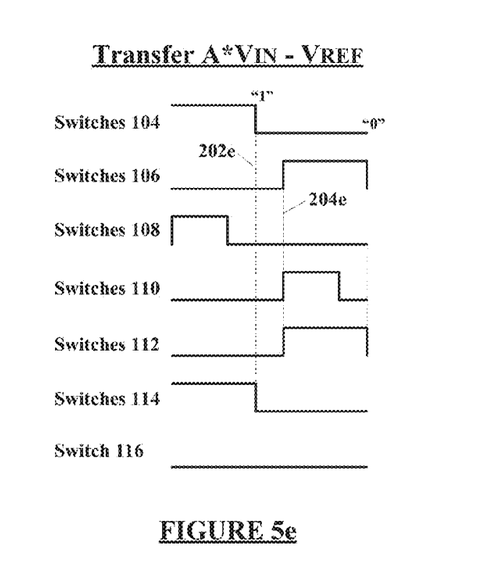

The opposite sequence is performed to achieve a −C*VREF charge to the summing node as shown in FIG. 5e with precharge phase 202e and transfer phase 204e. In order to achieve a C/2*VREF charge transfer, as shown in FIG. 5b, the transfer reference capacitors 134a and 134b are connected to VREFP and VREFM, respectively, during the precharge phase 202b and have their input plates short-circuited during the transfer phase 204b. The charge transferred is equal to C/2*(VREFP−VREFM)−0=C/2*VREF. In order to achieve a −C/2*VREF charge transfer, as shown in FIG. 5d, the transfer reference capacitors 134a and 134b are connected to VREFM and VREFP, respectively, during the precharge phase 202d and have their input plates short-circuited during the transfer phase 204d. The charge transferred is equal to C/2*(VREFM−VREFP)−0=−C/2*VREF. To achieve a zero charge transfer, as shown in FIG. 5c, the input plates of the reference capacitors are short-circuited during both the precharge and transfer phases 202c and 204c. Thus, the five equally distributed charge levels are C*VREF, C*VREF/2, 0, −C*VREF/2 and −C*VREF.

The intermediate levels C*Vref/2, 0 and −C*Vref/2 can also be achieved through other switching sequences than what are described herein. E.g., short-circuiting the input plates of 134a and 134b during precharge and connecting them to Vrefm and Vrefp, respectively, generates a C*Vref/2 charge transfer. In a similar fashion, short-circuiting the input plates of 134a and 134b during precharge and connecting them to Vrefp and Vrefm, respectively, generates a −C*Vref/2 charge transfer. Maintaining connection of the input plates of Crp and Crm to the same potential during precharge and transfer induces a zero charge transfer. FIGS. 5a-e merely show exemplary switching sequences. Other sequences may be used, as for example disclosed in U.S. Pat. No. 7,994,958, which has been assigned to Applicant and is hereby incorporated by reference, or U.S. Pat. No. 7,961,126 assigned to Applicant, which is hereby incorporated by reference. These show, for example, how a chopper voltage reference switching between P1 and P2 can be applied at the inputs ($V_{RERM}/V_{REFP}$) and how the remainder coming from the offset of the voltage reference can be integrated in such a way that it is cancelled after a given number of periods.

Having higher resolution, a highly linear DAC is crucial in a sigma delta ADCs as multi-bit designs lead to higher SNR, better stability and lower power and the various embodiments in this disclosure help to reach any level DAC with excellent linearity, especially when complex sequencing is used and when a low number of capacitances is provided. Here the idea is that when it is known how to design any level DAC, one can use a dithering algorithm, for example, as known from U.S. Pat. No. 7,961,126 so that the quantizer can change its resolution in a finer way to lead to less output quantization noise while keeping the dithering desirable effects (better THD and better idle tones cancellation).

Figure 3A:
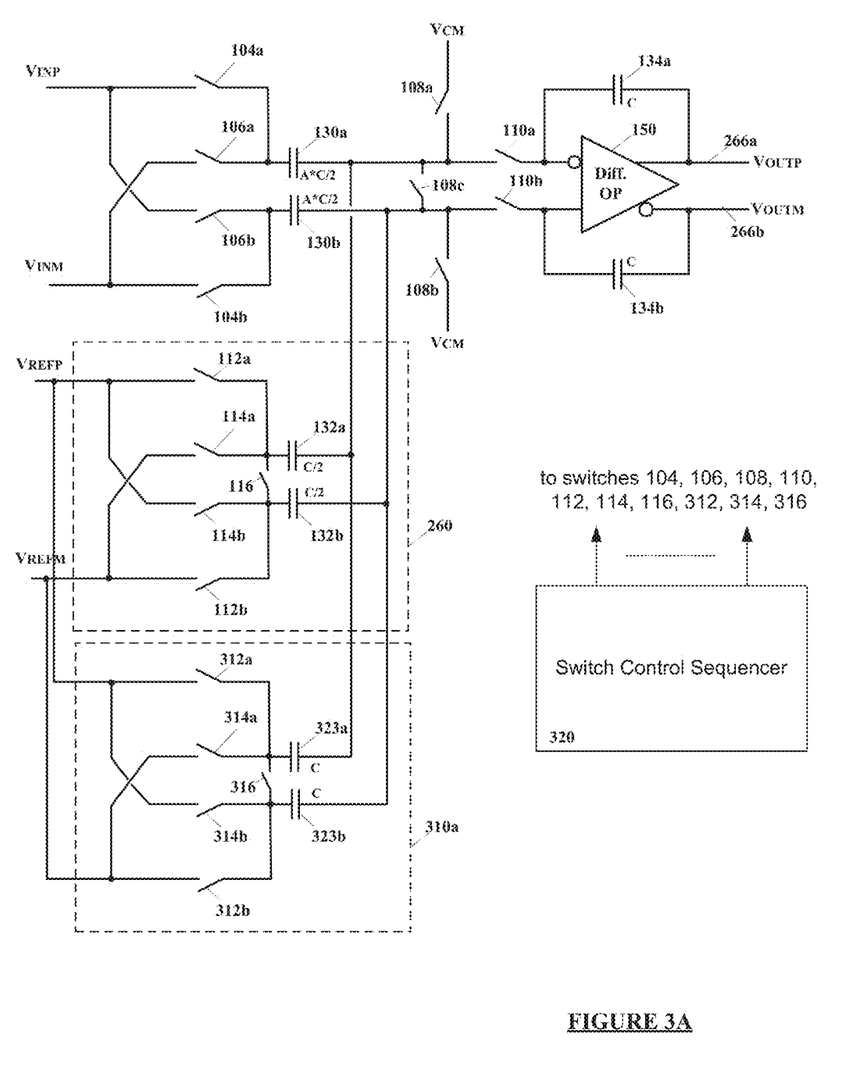
FIG. 3A shows a first embodiment of an input stage with a DAC.
Figure 3B:
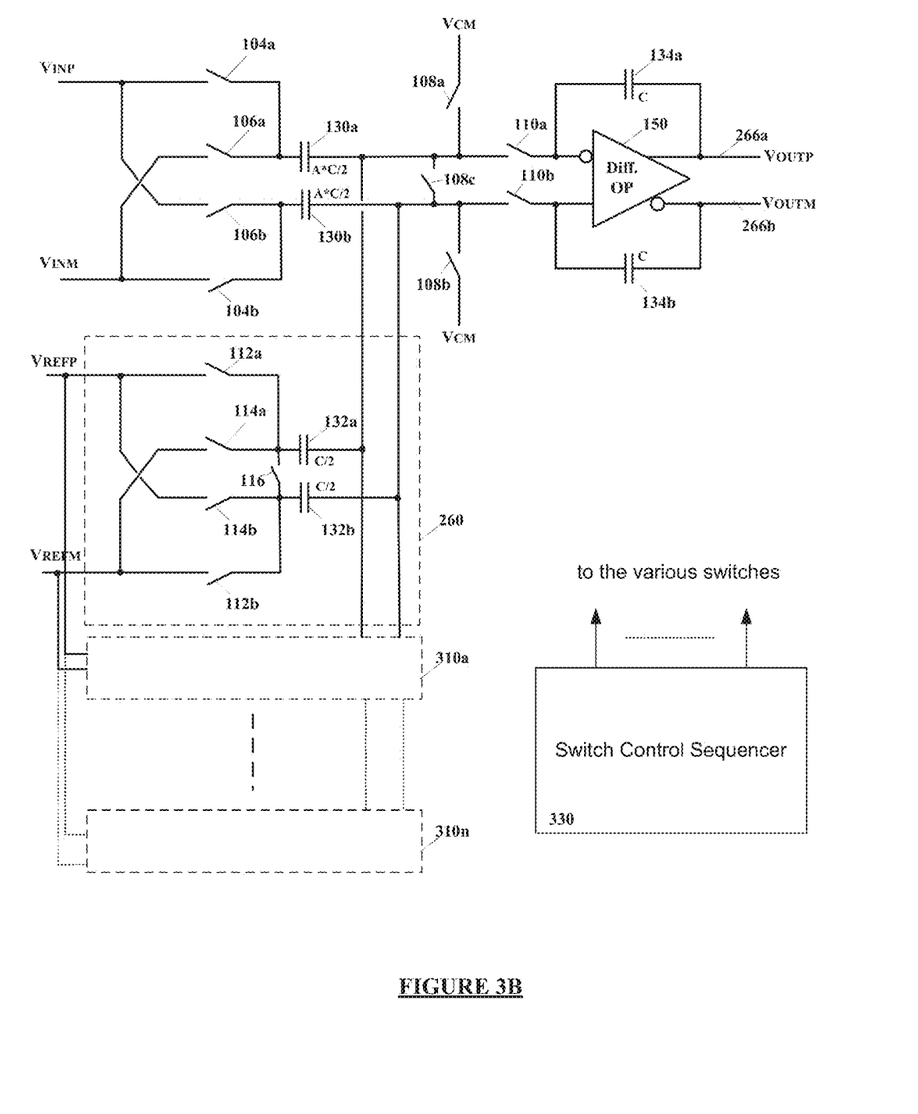
FIG. 3B shows a second embodiment of an input stage with a DAC.

To provide more levels, multiple reference stages 102, 310 as shown in FIGS. 3A and B are provided according to various embodiments. FIG. 3A shows the same circuit as FIG. 2 with an additional reference input stage 310a comprising the same architecture as stage 102. Thus, switches 312, 314, 316 correspond to switches 112, 114, and 116, respectively. The only difference is that the sampling capacitors 323a, b are dimensioned to have twice the capacitance of the capacitors 132a, b of stage 102 in this specific embodiment. However, dimensioning of the capacitors of multiple stages depends on the overall design and the number of levels that are to be realized, as will be explained in more detail below. Furthermore, a switch control sequencer 320 is provided to allow independent control of the switches of each stage 102 and 310a, thereby allowing each stage to receive a different digital input value. By coupling the outputs of the reference input stages 102, 310a in parallel, the output values of the individual stages are summed.

FIG. 3B shows an extended version of the embodiment of FIG. 3A, Here, a plurality of additional reference input stages 310a . . . n are coupled in parallel to reference input stage 102. The capacitors of each stage may be individually dimensioned as will be explained in more detail below. Switch control sequencer 330 provides separate control signals for each reference input stage to allow different digital input values to be fed to each stage 102, 310a . . . n.

The main problem of having multiple multi-level DACs in parallel, such as for example the 5-level DACs shown in FIGS. 3A and 3B, is the matching between the capacitors. However, according to various embodiments, all capacitors can have a different value and they can be even mismatched, for example, due to physical processing constraints. Each reference input stage may have a different, independent control input and each input can be, for example +2, +1, 0, −1, −2 in case each reference stage 102 is designed as shown in FIG. 2. Each of these values represents a Cref*Vref multiple in the DAC charge transfer, if the mismatch in each capacitor pair is neglected and if Vref=VREF+-VREF−. The mismatch in the capacitor pair in the differential structure is not considered since only the differential charge is integrated further, therefore, even if the capacitors are not perfectly matched on the + and the − side of the differential structure, it is equivalent to have a perfect matching with the average of the capacitors for the pure differential transfer. Therefore the system can be simplified and it can be considered that the capacitors on each side of the differential structure are equal. This results in n reference input stages 102, 310a . . . n of the DAC that are arranged in parallel as shown in FIGS. 3A and 3B with each one of these having a Cref(k) capacitor and transferring in (k)*Cref*Vref, wherein in(k) is the digital input value of the corresponding DAC, for example an integer that can represents the 5 levels +2, +1, 0, −1, −2 depending on the respective input k. The total charge transfer is the sum of all capacitors charge transfers since all reference input stage DACs 102, 310a . . . n are in parallel. Since all the capacitors can be different and are not necessarily matched, the total charge transferred by each of the DACs can be very different even though the reference voltage Vref is the same on each DAC. The idea here is to reach an N-level resolution where N is an integer, for example N>5, with the minimum amount of capacitors and the minimum amount of tonal behavior (or noise) in the output spectrum and to maintain the DAC linearity.

Out of the N desired levels of the DAC, 5 levels do not need multiple conversion sequencing, they may correspond to the switching sequences as discussed above and disclosed in U.S. Pat. No. 7,102,558 patent. These levels are the ones obtained when all 5 level DACs in parallel share the same digital input signals. This would be equivalent to have only one Cref with the equivalent value of Sum (Cref(k)). The "sequence" here is 1 sample long. For an odd N, N=2 m+1, each level needs to have a charge transferred equal in average to 2*Sum(Cref(k)) *Vref*j/m, where j is an integer between m and −m in order to maintain DAC linearity. This gives the equally spaced N levels allowed by the DAC. So at the input, the input of the DAC can be represented by an integer m between m and −m. For an even N, N=2m, each level needs to have a charge transferred equal in average to 2*Sum(Cref(k))*Vref*(2j−1)/ (N−1) where j is an integer between m and −m in order to maintain DAC linearity. For example for a 6-level DAC, the levels equally distributed will be 5, 3, 1, −1, −3, −5*Sum(Cref (k)*2*Vref/5.

An object is to have the total charge transferred always proportional to the sum of all Cref(k) capacitors. This is possible if a sequence of charge transfers is processed by the DAC. At each input processed, the DAC linearity may not be guaranteed but after a certain number of transfers, the linearity can be maintained if the total charge transferred is considered.

In a Sigma delta ADC, the DAC is typically used in the feedback loop of the modulator as shown in FIG. 1 and the output of the DAC is constantly integrated during a conversion. So as long as the linearity of the DAC is maintained, even if it only comes after several integrations, it will not impact the linearity of the Delta Sigma ADC (provided that the modulator loop stability is not degraded during the sequencing). In other words, a dynamic element matching or dynamic weight averaging technique can be applied here to maintain DAC linearity.

Since the largest charge transfers in a reference input stage is always equal to 2*Cref(k)*Vref, the total largest transfer is Sum (Cref(k))*2*Vref, so in order to maintain DAC linearity, all other transfers need to be proportional to Sum (Cref(k)). However, if the capacitors are not matched this is only possible with chosen sequences for each input so that in average the total charge transferred is proportional to Sum(Cref(k)).

The capacitor values can also be chosen such that they are different multiples of a unit C capacitance. In this case, according to an embodiment, each parallel reference input stage 102, 310a as shown in FIG. 3A or reference input stages 102, 310a . . . n as shown in FIG. 3B can have a different number of C parallel capacitors. This may be in particular beneficial, if the capacitors are formed in a bank of capacitors using predefined values, such as ¼*C, ½*C, etc. The choice of the splitting of these capacitors can be linked to the desired resolution (N levels) that the user wants to achieve in the following manner: There is a minimum number of capacitors and a minimum number of splits possible in order to ensure the DAC linearity and proper charge transfers if the capacitors are all considered equal. This number of splits and capacitors is only a function of the number of levels N which are desired. For example for N=5 only one reference capacitor is used, no split. According to the symmetric structure of a reference input stage 102, 310a . . . n as shown in FIGS. 2 and 3A, B, a reference capacitor is considered to be formed by ½ capacitor 132a, 323a in the positive branch and ½ capacitor 132b, 323b in the negative branch. For N=9, 2 additional DACs with respective capacitors may be used, equally split in two. For N=7, 2 additional DACs with respective capacitors are used, one equal to 2*C one equal to C.

Figure 4:
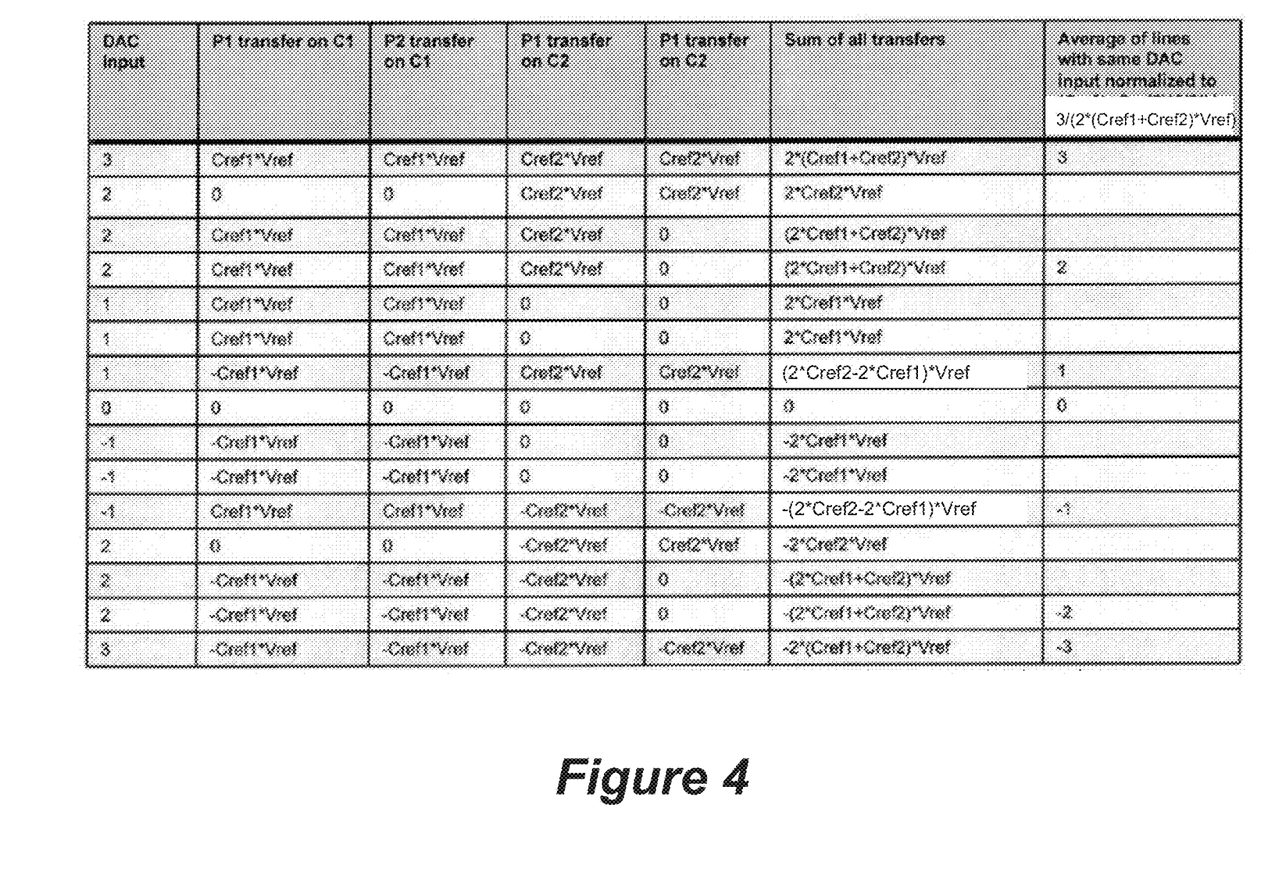
FIG. 4 a table of possible transfer charges according to a specific embodiment using the DAC of FIG. 3A.

An idea how to find this minimum is to start with a sum of Cref units that is a multiple of N−1. For example, with N=9, one can start with 8 capacitors and list all the splitting of 8 unit capacitors, and all the charge transfers associated with these splits of unit capacitors. Once these transfers have been identified, one can list the transfers that lead to the same charge transfer, if the capacitors are considered as equal. For example FIG. 4 shows all possible transfers for a 7 level DAC with a structure as shown in FIG. 3A and a split 2*C/C between two parallel reference input stages 102, 310a is detailed. C1 of the first stage 102 is therefore dimensioned as C and C2 of the second parallel stage 310a is dimensioned as 2*C. In this case, if all the charge transfers supposed to correspond to a certain DAC input IN, can be averaged in a certain way with a specific sequence so that the same number of times each Cref(k) is integrated, then the sequence is valid and the split can be considered. In other words, the split must include redundancy in the charge transfers so that the non linear charge transfers can be averaged out and re-linearized after a minimal sequence. For example in the table of FIG. 4, the sum of each line leads to the sum of all capacitors *Vref of the input stages 102, 310a, but when the input=2, there are only two possibilities, i.e., a double charge transfer on Cref1 plus a single transfer on Cref2 or a double charge transfer on Cref2. These possibilities can be averaged out if we have 2 times more transfers using 2*Cref1+Cref2 compared to the transfers using 2*Cref2. Thus, a sequence of three conversions of the digital value 2 would require two conversions providing each the sum (2*Cref1+Cref2)*Vref and one conversion providing the sum (2*Cref2)*Vref resulting in an transfer of (4*Cref1+2*Cref2)*Vref+2*Cref2*Vref=4*(Cref1+Cref2)*Vref and thus proportional to (Cref1+Cref2). This is the only way to cancel the mismatch on Cref1 and Cref2 (compared to the unit C) and to have the right average and the closest value of charge transfers at all times. As long as the redundancy allows the averaging on all capacitors for each input DAC value, a minimum sequence can be found guaranteeing that the split can be used. Thus, the table in FIG. 4 shows a single conversion for DAC input ±3 and 0 which are proportional to the sum of Cref1 and Cref2. Furthermore, the table in FIG. 4 shows a sequence of three conversions for DAC input ±2 and ±1, which when averaged are also proportional to the sum of Cref1 and Cref2. In particular, for ±2 the average value would be 4*(Cref1+Cref2)*Vref/3 and for ±1, the average value would be 2*(Cref1+Cref2)*Vref/3.

According to further embodiments, these sequences can be randomized to avoid tones in the output spectrum. The choice of the j can be random as long as all integers from 1 to n are taken after the DAC has been processed n times with the input code 2n−1. These sequences can even be averaged over multiple input codes. However these sequences become more complex. The averaging will always take multiple input codes in account with the same goal of averaging the DAC transfers to be proportional to Sum(Cref(k))*Vref. It can be observed that for a given m, the complimentary to 2n (2n−m) can follow the complementary sequence to cancel the DAC non linearity.

Avoiding tones in the output spectrum and minimizing the length of the necessary sequences is important to try to keep the stability of the system and not perturbing too much its behavior. For example if we take the 7-level DAC and a level 2 to convert at the input of the DAC, one allowable sequence is described in Table of FIG. 4 and has a length of 3. If this sequence is obtained with equal capacitors Cref1 and Cref2 (wherein Cref1=Cref2=C), the first sample of the sequence will integrate 2*Cref2*Vref=2*C*Vref and the two following ones will integrate (2*Cref1+Cref2)*Vref=3*C*Vref.

This difference cannot necessarily be handled by the system and can perturbate its stability, even though at the end of the 3-samples sequence the amount of charge integrated is perfectly fine. In order to optimize the stability of the system, the sequences can be found in order to limit the variation of the integrated value at the output of the DAC at each sample, or specific splits of the capacitors may be found that optimize this variation. For example in the same sequence in the 7-level DAC, if Cref1=1*C and Cref2=2*C, the integrated charge is equal to 4*C*Vref at each sample. If the matching is not exact and 2*Cref1 is different than Cref2, the DAC linearity is still guaranteed and the mismatch will only impact the total charge integrated at each sample and therefore will impact the stability but not the linear performance of the system.

Such sequences and splits that ensure that the variation of the total integrated charge is close or equal to the desired value at each sample are preferred over the rest as they minimize the perturbation of the stability of the system. This is the case for example if a 4n+1 level DAC is desired and if the split is the natural split in n unit capacitors using the natural sequence that lead to the different 5 levels of the original 5-level DAC.

In these charge transfers, a chopper modulated Vref can be used and have charge transfers in each DAC in parallel follow the sequences as disclosed in the U.S. Pat. No. 7,994,958 in order to cancel the offset in each DAC.

For this an odd transfer and an even transfer are defined at the input of each DAC. An even transfer is when an input of the DAC is even (+/−2 or 0) and an odd transfer is when the input is odd (+/−1). The even transfers are canceling the offset of the Vref per the teachings of U.S. Pat. No. 7,994,958. The odd transfers need a sequence of 2 samples to completely cancel the offset. These sequences need to be performed on each DAC individually to cancel completely the offset at the output of the DAC. Here again a randomization of these sequences of 2 samples per DAC can be realized to further break output tones in the output spectrum. For example, a plurality of switching sequences may be available, for example the 3 sample sequences as discussed above, to generate transferred output charges associated with one DAC input value for the first and/or second capacitor switch units. For a randomization, the sequencer can be configured to shuffle an order of these switching sequences with a pseudo random algorithm.

One embodiment of this new implementation of a DAC in a sigma-delta ADC is a 7-level DAC as shown in FIG. 3A and the table in FIG. 4, where the resolution is larger than the 5-level DAC but without too much drawback in the sequence length (e.g., a maximum of 3 samples per level in the embodiment shown in FIG. 4). Large number of DACs in parallel require large oversampling ratios in the sigma delta ADC in which the DAC is implemented so that the averaging on n samples can be done over all possible levels of the DAC and such that any remainder of the non linearity error can be neglected over the number of samples. In order to minimize the sequence length and therefore the possibility of having large remainders at the end of the conversion, the more complex sequences need to be applied wherein at each sample the sequencer will try to enable reference input charge transfers in all reference input stages so that the total DAC charge transfers is closer to an integer value of Sum(Cref(k))*Vref. The sequencer can maintain a count of the total charge integrated on each DAC and try to equate this sum at each sample or at least be closer to have this sum equal on the n DACs.

What is claimed is:

1. A digital-to analog converter (DAC) of the charge transfer type for use in a sigma delta modulator for generating N output levels, wherein an output level is defined by a respective amount of charge transferred by the DAC, comprising:
a first capacitor switch unit receiving a reference voltage and a first digital input value and being operable to transfer a first plurality of output charges,
at least one second capacitor switch unit receiving said reference voltage and a second digital input value, wherein an output of the second capacitor switch unit is coupled in parallel with an output of said first capacitor switch unit to generate a sum of said first plurality of transferred output charges and a second plurality of transferred output charges from said second capacitor switch unit; and
a sequencer operable to control switches of said first and second capacitor switch units wherein switching sequences according to individual first and second digital input values are provided for every DAC input value to generate said N output levels.

2. The DAC according to claim 1, wherein the switching sequences are chosen such that at least one of said N output levels generated by respective first and second plurality of transferred output charges is proportional to a sum of the capacitors of said first and second capacitor switch unit.

3. The DAC according to claim 1, wherein for each of said N output levels which is not proportional to a sum of the capacitors of said first and second capacitor switch unit, at least one alternative switching sequence is provided to transfer a respective charge, wherein an average DAC output charge of sequential DAC input values having the same value is proportional to a sum of the capacitors of said first and second capacitor switch unit by changing associated switching sequences for said first and/or second capacitor switch unit.

4. The DAC according to claim 3, wherein a plurality of switching sequences is available to generate transferred output charges associated with one DAC input value for said first and/or second capacitor switch units and the sequencer is configured to shuffle an order of said plurality of switching sequences with a pseudo random algorithm.

5. The DAC according to claim 3, wherein a switching sequence comprises a sampling phase followed by a transfer phase and wherein the voltage reference is generated by a chopper voltage reference toggling between the sampling and transfer phases.

6. The sigma delta modulator according to claim 5, wherein said capacitive input switch unit transfers an output charge having a gain A.

7. The sigma delta modulator according to claim 5, further comprising a plurality of second capacitor switch units coupled in parallel with said first capacitor switch unit.

8. The DAC according to claim 3, wherein the DAC is configured to generate 7 output levels.

9. The sigma delta modulator according to claim 8, further comprising a switching network coupling the parallel coupled outputs of said capacitive switch units and said capacitive input switch unit with a differential amplifier.

10. The DAC according to claim 1, wherein a switching sequence comprises a sampling phase followed by a transfer phase.

11. A sigma delta modulator comprising a DAC according to claim 1, comprising a capacitive input switch unit receiving an input signal and having an output coupled in parallel with the outputs of the parallel coupled capacitive switch units.

12. A method for generating N output levels by means of a digital-to analog converter (DAC) of the charge transfer type, comprising:
generating a first one of a plurality of output charges defined by a first digital input value by a first capacitor switch unit receiving a reference voltage by controlling a first switching sequence according to at least one predefined switching sequence defined by said first digital input value to transfer the first one of a plurality of output charges,
generating a second one of a plurality of output charges defined by a second digital input value by a second capacitor switch unit receiving said reference voltage by controlling a second switching sequence according to at least one predefined switching sequence defined by said second digital input value to transfer the second one of a plurality of output charges, wherein the first and second digital input value depend on a selected digital input value for the DAC;
adding said first and second one of a plurality of output charges to generate an output level of the DAC.

13. The method according to claim 12, wherein the first and second switching sequences are chosen such that at least one of said N output levels generated by respective first and second plurality of transferred output charges is proportional to a sum of capacitance values of said first and second capacitor switch unit.

14. The method according to claim 12, wherein for each of said N output levels which is not proportional to a sum of capacitance values of said first and second capacitor switch unit, at least one alternative switching sequence is provided to transfer a respective charge, wherein an average DAC transferred charge output charge of sequential DAC input values having the same value is proportional to a sum of the capacitance values of said first and second capacitor switch unit by changing associated switching sequences for said first and/or second capacitor switch unit.

15. The method according to claim 14, wherein a plurality of switching sequences is available to generate transferred output charges associated with one DAC input value for said first and/or second capacitor switch units and the sequencer shuffles an order of said plurality of switching sequences with a pseudo random algorithm.

16. The method according to claim 14, wherein a switching sequence comprises a sampling phase followed by a transfer phase and further comprising generating the voltage reference by a chopper voltage reference toggling between the sampling and transfer phases.

17. The method according to claim 14, wherein the DAC generates 7 output levels.

18. The method according to claim 12, wherein a switching sequence comprises a sampling phase followed by a transfer phase.

19. The method according to claim 12, further comprising transferring a plurality of second output charges which are added to the first one of a plurality of transferred output charges.

20. A method of operating a sigma delta modulator using a digital-to analog converter (DAC) of the charge transfer type, comprising
generating a first one of a plurality of output charges defined by a first digital input value by a first capacitor switch unit of the DAC receiving a reference voltage by controlling a first switching sequence according to at least one predefined switching sequence defined by said first digital input value to transfer the first one of a plurality of output charges, generating a second one of a plurality of output charges defined by a second digital input value by a second capacitor switch unit of the DAC receiving said reference voltage by controlling a second switching sequence according to at least one predefined switching sequence defined by said second digital input value to transfer the second one of a plurality of output charges, wherein the first and second digital input value depend on a selected digital input value for the analog-to-digital converter of the sigma-delta modulator;

adding said first, and second output charges of the DAC to generate an output charge of the DAC corresponding to a digital input value of the DAC;

receiving an input voltage at a capacitive input unit generating a third output charge;

adding the third output charge to the first and second output charge of the DAC to generate an output voltage of an input stage of the sigma delta modulator.

21. The method according to claim 20, further comprising integrating said output voltage of the input stage.

22. The method according to claim 21, further comprising quantizing the integrated output signal.

23. The method according to claim 20, wherein the first and second switching sequences are chosen such that at least one of said output charges of the DAC is proportional to a sum of capacitance values of said first and second capacitor switch unit.

24. The method according to claim 20, wherein for each transferred output charge of the DAC corresponding to a digital input of the DAC which is not proportional to a sum of capacitance values of said first and second capacitor switch unit, at least one alternative switching sequence is provided for said first and/or second capacitive switch units of the DAC to generate an average DAC output charge that is proportional to a sum of the capacitance values of said first and second capacitor switch unit by changing associated switching sequences said first and/or second capacitor switch unit for consecutive DAC input values having the same value.

25. The method according to claim 24, wherein a plurality of switching sequences is available to generate transferred output charges associated with one DAC input value for said first and/or second capacitor switch units and the sequencer shuffles an order of said plurality of switching sequences with a pseudo random algorithm.

26. The method according to claim 24, wherein a switching sequence comprises a sampling phase followed by a transfer phase and further comprising generating the voltage reference by a chopper voltage reference toggling between the sampling and transfer phases.

27. The method according to claim 24, wherein the DAC generates 7 output voltages.

28. The method according to claim 20, wherein a switching sequence comprises a sampling phase followed by a transfer phase.

29. The method according to claim 20, further comprising transferring a plurality of second output charges which are added to the first one of a plurality of output charges.

\* \* \* \* \*